(12) United States Patent
Hwang et al.

(10) Patent No.: US 7,315,044 B2
(45) Date of Patent: Jan. 1, 2008

(54) THIN FILM TRANSISTOR ARRAY PANEL AND MANUFACTURING METHOD THEREOF

(75) Inventors: Chang-Won Hwang, Yongin (KR); Woo-Suk Chung, Anyang (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/534,785

(22) PCT Filed: Nov. 14, 2003

(86) PCT No.: PCT/KR03/02460

§ 371 (c)(1),
(2), (4) Date: May 13, 2005

(87) PCT Pub. No.: WO2004/044991

PCT Pub. Date: May 27, 2004

(65) Prior Publication Data

US 2006/0044488 A1 Mar. 2, 2006

(30) Foreign Application Priority Data

Nov. 14, 2002 (KR) ...................... 10-2002-0070708

(51) Int. Cl.
*H01L 29/04* (2006.01)
(52) U.S. Cl. ............................ 257/72; 257/59; 257/351
(58) Field of Classification Search .................. 257/59, 257/72, 351

See application file for complete search history.

(56) References Cited

U.S. PATENT DOCUMENTS 6,043,971 A    3/2000  Song et al.

(Continued)

FOREIGN PATENT DOCUMENTS

JP          05-281577           10/1993

(Continued)

OTHER PUBLICATIONS

Patent Abstracts of Japan, Publication No. 11-194368, Jul. 21, 1999, 2 pages.

(Continued)

*Primary Examiner*—Sara Crane
(74) *Attorney, Agent, or Firm*—MacPherson Kwok Chen & Heid LLP

(57) ABSTRACT

A thin film transistor (TFT) array panel includes: an insulating substrate (110); first and second semiconductor members (151 *a,b*) formed on the substrate and having opposite conductivity; a first gate member (121*a*) formed on a first layer (140), insulated from the first and the second semiconductor members and overlapping one of the first and the second semiconductor members; a second gate member (122*a*) formed on the first layer (140), separated from the first gate member, and insulated from the first and the second semiconductor members (151 *a,b*), the second gate member (122*a*) not overlapping the first and the second semiconductor members; a first data member (162) formed on a second layer (160), connected to one of the first and the second semiconductor members (151 *a,b*) and insulated from the first (121*a*) and the second (122*a*) gate members; and a first connection (123) formed on the second layer (160) and connecting the first gate member (121*a*) and the second gate member (122*a*).

15 Claims, 9 Drawing Sheets

U.S. PATENT DOCUMENTS

| | | |
|---|---|---|
| 6,215,541 B1 | 4/2001 | Song et al. |
| 6,278,131 B1 | 8/2001 | Yamazaki et al. |
| 6,587,160 B2 | 7/2003 | Lee et al. |
| 7,226,822 B2 * | 6/2007 | Takayama et al. .......... 438/151 |
| 2001/0004253 A1 | 6/2001 | Fukutoku et al. |
| 2005/0214990 A1 * | 9/2005 | Yamazaki et al. .......... 438/155 |

FOREIGN PATENT DOCUMENTS

| | | |
|---|---|---|
| KR | 10-1998-017374 | 6/1998 |
| KR | 10-2001-0039073 | 5/2001 |
| KR | 10-2001-0040108 | 5/2001 |
| WO | WO 98/31050 | 7/1998 |

OTHER PUBLICATIONS

English Language Abstract, KR Patent Publication No. 10-1998-017374, Jun. 5, 1998, 1 page.

English Language Abstract, KR Patent Publication No. 10-2001-0039073, May 15, 2001, 1 page.

English Language Abstract, KR Patent Publication No. 10-2001-0040108, May 15, 2001, 1 page.

English Language Abstract, JP Patent Publication No. 05-281577, Oct. 29, 1993, 1 page.

* cited by examiner

THIN FILM TRANSISTOR ARRAY PANEL AND MANUFACTURING METHOD THEREOF

BACKGROUND OF THE INVENTION (a) Field of the Invention

The present invention relates to a thin film transistor array panel and a method thereof, and in particular, to a polysilicon thin film transistor array panel.

(b) Description of the Related Art

Thin film transistors (TFT) are used for driving pixels in a liquid crystal display (LCD) and electro luminescence (EL) display. A panel including the TFTs also includes a plurality of gate lines transmitting scanning signals for turning on and off the TFTs and a plurality of data lines transmitting data signals for the display of the pixels.

The TFTs include polysilicon or amorphous silicon as active layers. When the display panel includes polysilicon TFTs for switching the data signals to be supplied to the pixels, driving circuits for generating the scanning signals and the data signals can be also formed on the display panel along with the TFTs for the pixels such that cost and complexity for mounting driving chips are reduced.

The driving circuits include a plurality of driving TFTs, which have the same layered structure as the TFTs for the pixels (referred to as "pixel TFTs" hereinafter). The driving circuits typical include both N type TFTs and P type TFTs.

The TFTs include polysilicon members doped with N type or P type impurity. In order to both the N type and the P type polysilicon members, ion implantation is performed twice usually using the gate lines as an implantation mask. The gate lines exposed to the ionic impurity are charged to yield electrostatic discharge (ESD) damages. The ESD damages are generated between adjacent gate members and they become severe when the sizes of the gate members are different since the voltage difference become larger.

The large current due to the ESD makes damage on a gate insulating layer located between the gate lines and the silicon active layers and it melts the silicon layers to be agglomerated or evaporated.

In order to ESD protection, protection diodes are formed in the manufacturing process. However, since the protection diodes are activated after forming the data lines, there is no ESD protection mechanism before the formation of the data lines.

Although a technique for minimizing the difference in the areas between adjacent gate members is suggested, there is difficulty in designing the gate members to fixed areas. In addition, this technique is somewhat effective in reducing defect ratio, but it is insufficient for preventing the ESD damage due the difference in impurity doping amount between the gate members.

SUMMARY OF THE INVENTION

A motivation of the present invention is to provide a TFT array panel and a manufacturing method thereof for preventing ESD damage due to impurity implantation.

A thin film transistor array panel is provided, which includes: an insulating substrate; first and second semiconductor members formed on the substrate and having opposite conductivity; a first gate member insulated from the first and the second semiconductor members and overlapping one of the first and the second semiconductor members; a second gate member formed on the same layer as the first gate member, separated from the first gate member, and insulated from the first and the second semiconductor members, the second gate member not overlapping the first and the second semiconductor members; a first data member connected to one of the first and the second semiconductor members and insulated from the first and the second gate members; and a first connection formed on the same layer as the first data member and connecting the first gate member and the second gate member.

The first and the second semiconductor members preferably include polysilicon.

When the first gate member overlaps the first semiconductor member, the TFT array panel may further include a third gate member formed on the first layer, separated from the first and the second gate members, insulated from the first and the second semiconductor members, and overlapping the second semiconductor member and may further include a second connection formed on the second layer and connecting the second gate member and the third gate member.

The TFT array panel may further include: a fourth gate member formed on the first layer, separated from the first, the second, and the third gate members and insulated from the first and the second semiconductor members, the fourth gate member not overlapping the first and the second semiconductor members; and a second connection formed on the second layer and connecting the third gate member and the fourth gate member.

The TFT array panel may further include: fifth and sixth gate members formed on the first layer, separated from the first to the fourth gate members, insulated from the first and the second semiconductor members, and overlapping the first and the second semiconductor members, respectively; a seventh gate member formed on the first layer, separated from the first to the sixth gate members and insulated from the first and the second semiconductor members, the seventh gate member not overlapping the first and the second semiconductor members; and third and fourth connections formed on the second layer and connecting the fifth and the sixth gate members to the seventh gate member.

The TFT array panel may further include a fifth connection formed on the second layer and connecting the first semiconductor member and the second semiconductor member.

The TFT array panel may further include: third and fourth semiconductor members formed on the substrate and having opposite conductivity; eighth and ninth gate members formed on the first layer, separated from the first to the seventh gate members, insulated from the first to the fourth semiconductor members, overlapping the third and the fourth semiconductor members, respectively; and sixth and seventh connections formed on the second layer and connecting the fifth and the sixth gate members to the eighth and the ninth gate members, respectively.

The TFT array panel may further include: tenth and eleventh gate members formed on the first layer, insulated from the first to the fourth semiconductor members and overlapping the third and the fourth semiconductor members, respectively; twelfth and thirteenth gate members formed on the first layer, separated from the first to the eleventh gate members, and insulated from the third and the fourth semiconductor members, the twelfth and the thirteenth gate members not overlapping the first to the fourth semiconductor members; and eighth and ninth connections formed on the second layer and connecting the tenth and the eleventh gate members to the twelfth and the thirteenth gate members, respectively.

The TFT array panel may further include a seventh connection formed on the second layer and connecting the third semiconductor member and the fourth semiconductor member.

The first data member may be connected to the first and the third semiconductor members, and the TFT array panel may further include a second data member connected to the second and the fourth semiconductor members and insulated from the first to the thirteenth gate members. The first data member preferably transmits a gate-off voltage for tuning off a thin film transistor and the second data member preferably transmits a gate-on voltage for turning on the thin film transistor.

The TFT array panel may further include: a first insulating layer interposed between the first and the second semiconductor members and the first and the second gate members; and a second insulating layer interposed between the first and the second gate members and the first data member, wherein the second insulating layer has a first contact hole for connecting the first gate member and the second gate member, and the first and the second insulating layer has a second contact hole for connecting the first data member and the one of the first and the second semiconductor members.

A method of manufacturing a thin film transistor (TFT) array panel is provided, which includes: forming a blocking layer on a substrate;, depositing an amorphous silicon film on the blocking layer; crystallizing the amorphous silicon film into a polysilicon film; patterning the polysilicon film to form first and second polysilicon members; forming a gate insulating layer on the first and the second polysilicon members; forming a plurality of first conductive members overlapping the first and the second polysilicon members; forming a plurality of second conductive members not overlapping the first and the second polysilicon members; implanting N type impurity to form a plurality of N type impurity regions in the first polysilicon member; implanting P type impurity to form a plurality of P type impurity regions in the second polysilicon member; depositing an interlayer insulating layer on the first and the second conductive members and the N type and the P type impurity regions; patterning the interlayer insulating layer and the gate insulating layer to form a plurality of first contact holes exposing portions of the first and the second conductive members and to form a plurality of second contact holes exposing portions of the N type and the P type impurity regions; forming a plurality of connections connected to the first and the second conductive members through the first contact holes; and forming a plurality of data members connected to the N type and the P type impurity regions through the second contact holes.

The N type impurity implantation precedes or follows the P type impurity implantation.

The data members may include first and second voltage lines respectively connected to the N type and the P type impurity regions for transmitting first and second voltages; and may include a connecting member connected to both the N type impurity region and the P type impurity region.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

Figure 1:
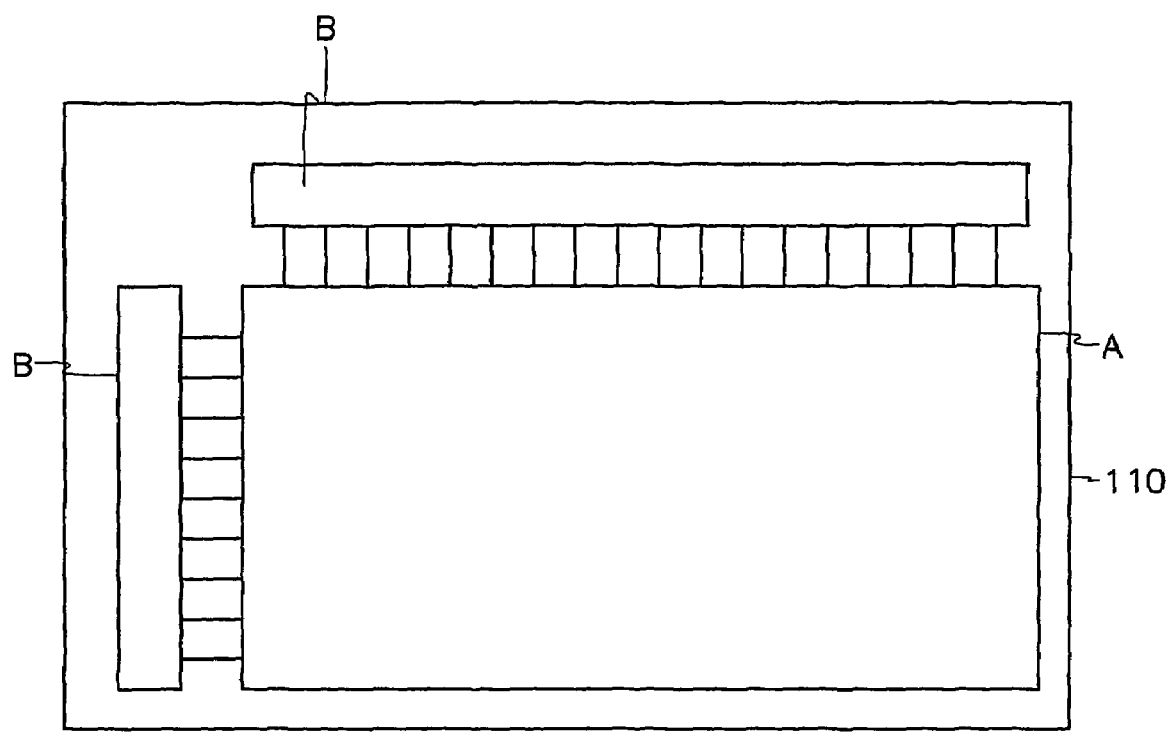
FIG. 1 is a schematic diagram of a TFT array panel according to an embodiment of the present invention.

The present invention now will be described more fully hereinafter with reference to the accompanying drawings, in which preferred embodiments of the inventions are shown.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Now, polysilicon TFT array panels and manufacturing methods thereof according to an embodiment of the present invention will be described in detail with reference to the accompanying drawings.

FIG. 1 is a schematic diagram of a TFT array panel according to an embodiment of the present invention.

Referring to FIG. 1, a TFT array panel according to an embodiment of the present invention includes a display area A provided with a plurality of pixel electrodes (not shown), a plurality of TFTs (not shown) for switching electrical signals supplied to the pixel electrodes, and a plurality of signal lines such as a plurality of gate lines (not shown) and a plurality of data lines (not shown) for transmitting the signals to the TFTs, and a plurality of driving circuit areas B provided with a plurality of circuit elements for controlling the signals supplied to the display area A. The circuit elements on the driving circuit areas B include a plurality of TFTs.

An exemplary configuration of the driving circuit areas B according to an embodiment of the present invention is described in detail with reference to FIGS. 2A and 2B.

Figure 2A:
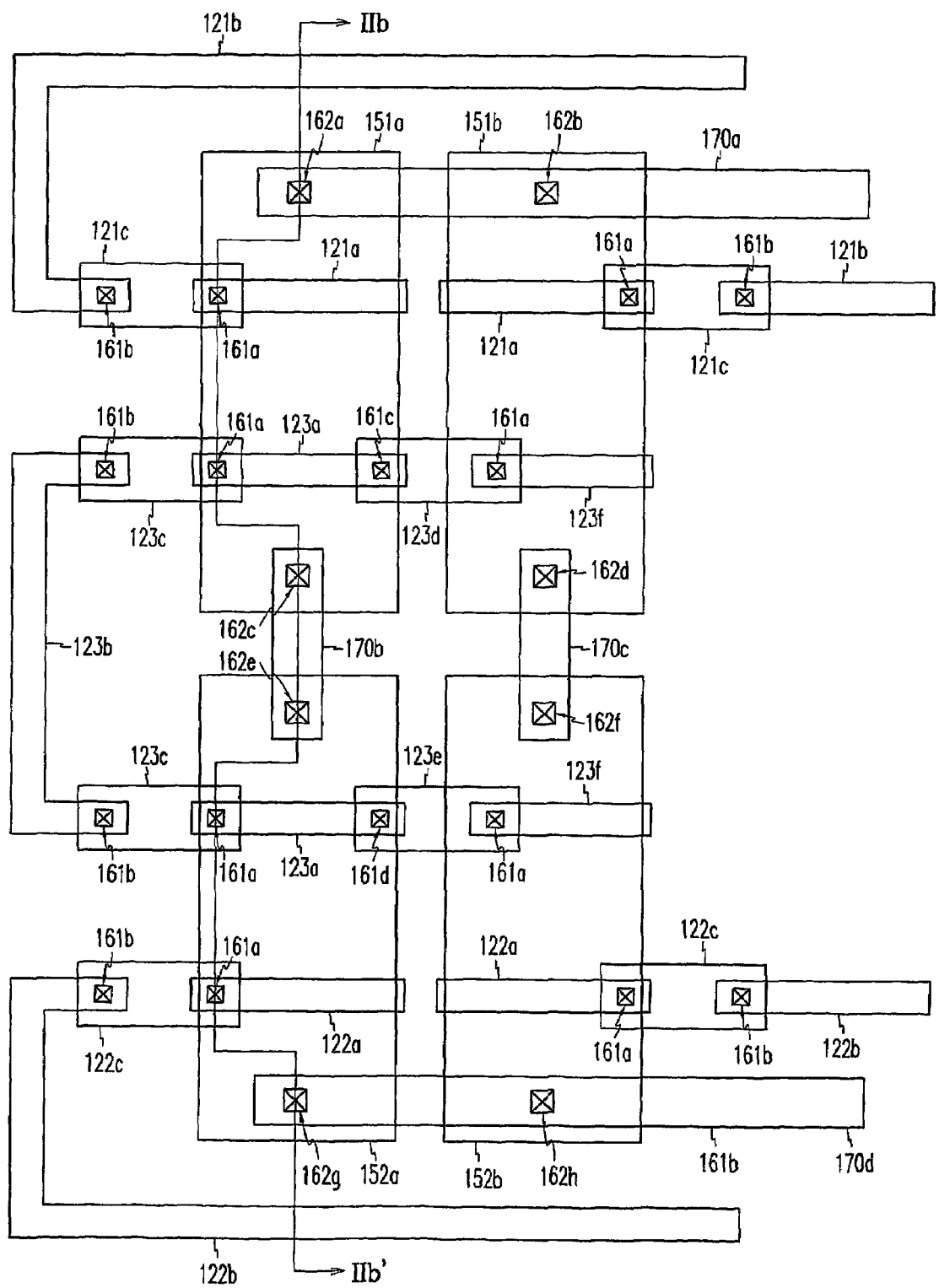
FIG. 2A is an exemplary layout view of a driving circuit area of a polysilicon TFT array panel.
Figure 2B:
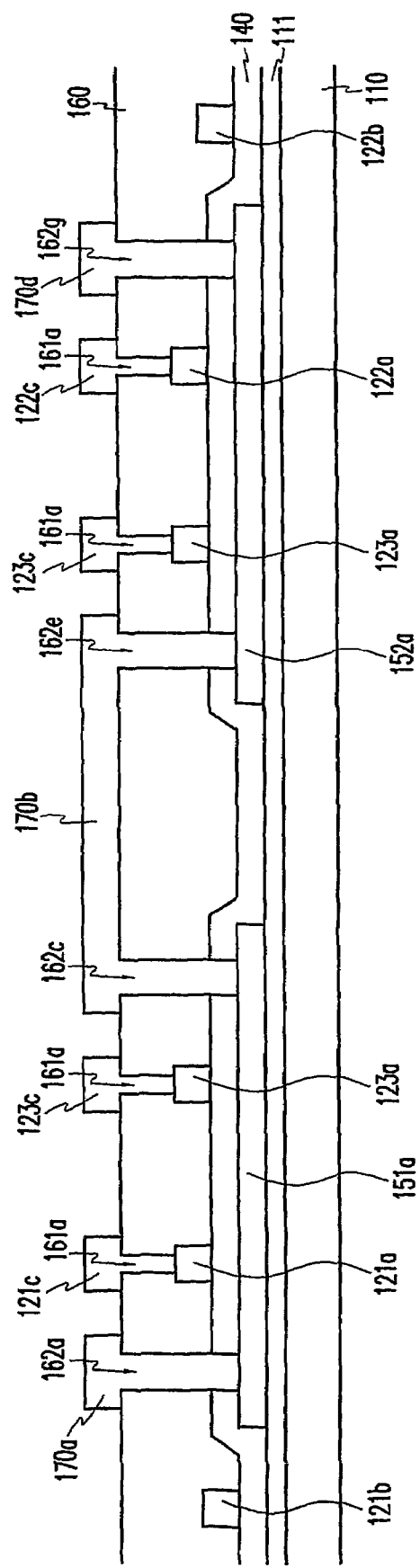
FIG. 2B is a sectional view of the driving circuit area shown in FIG. 2A taken along the line IIB-IIB'.

FIG. 2A is an exemplary layout view of a driving circuit area of a polysilicon TFT array panel, and FIG. 2B is a sectional view of the driving circuit area shown in FIG. 2A taken along the line IIB-IIB'.

Figure 3A:
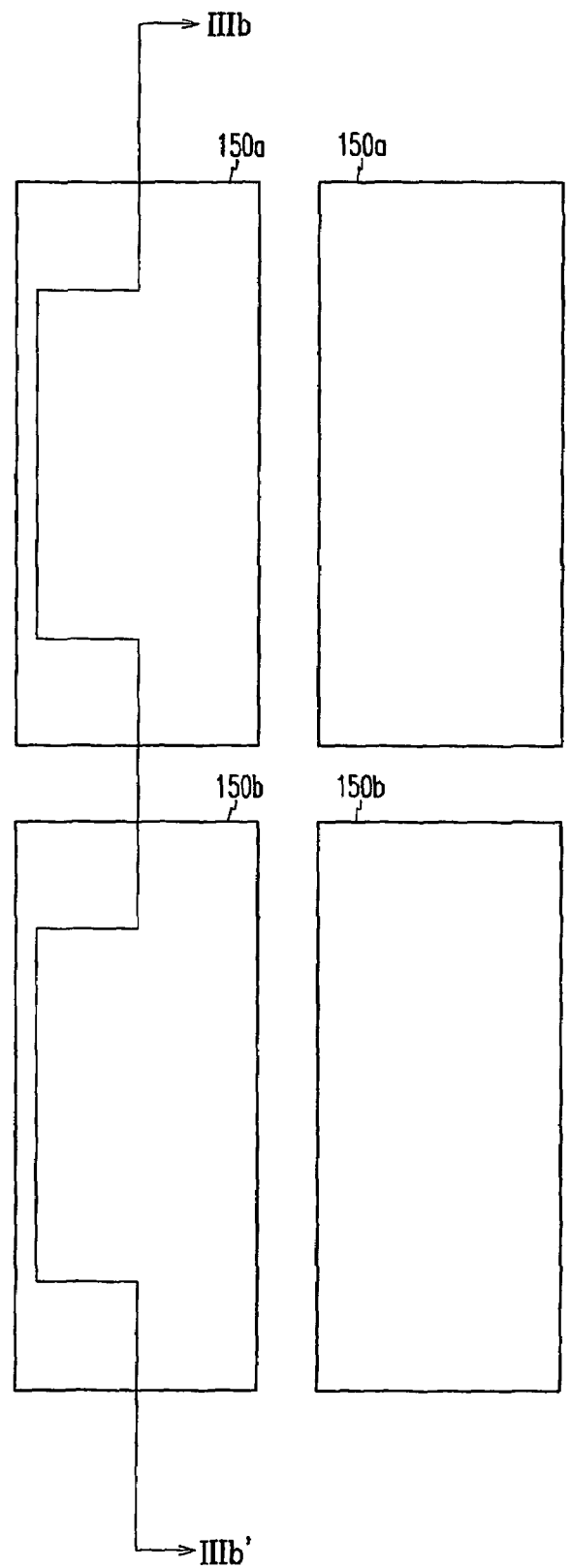
FIGS. 3A, 4A and 5A are layout views of a TFT array panel in intermediate steps of a manufacturing method thereof.
Figure 3B:
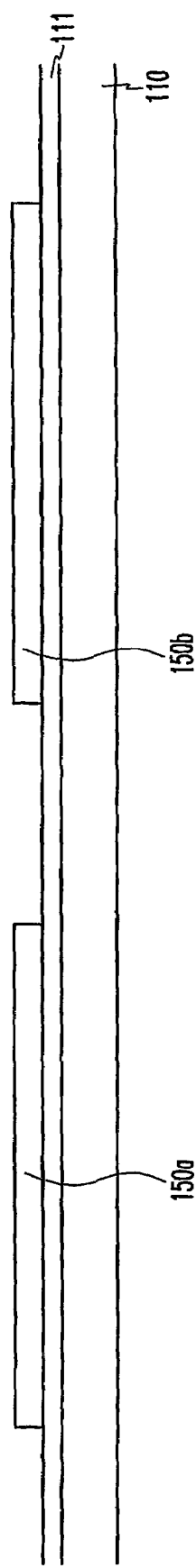
FIGS. 3B, 4B and 5B are sectional views of the TFT array panel shown in FIGS. 3A, 4A and 5A taken along the lines IIIB-IIIB', IVB-IVB' and VB-VB', respectively.

As shown in FIGS. 3A and 3B, a blocking layer 111 is formed on a transparent insulating substrate 110. A pair of first and second semiconductor members 151a and 151b and a pair of third and fourth semiconductor members 152a and 152b are formed on the blocking layer 111. The first and second semiconductor members 151a and 151b have opposite conductivity, while the third and fourth semiconductor members 152a and 152b also have opposite conductivity.

A gate insulating layer 140 is formed on the semiconductor members 151a, 151b, 152a and 152b (abbreviated as 151a-152b) preferably made of polysilicon, and a plurality of gate members 121a, 121b, 122a, 122b, 123a, 123b and 123f (abbreviated as 121a-123f) are formed on the gate insulating layer 140.

The gate members 121a-123f include a first group of gate members 121a and 121b, a second group of second gate members 122a and 122b, and a third group of third gate members 123a, 123b and 123f located between the first group of the gate members 121a and 121b and the second group of the gate members 122a and 122b in the first direction.

The first group of gate members 121a and 121b includes first control electrodes 121a intersecting the first and the second semiconductor members 151a and 151b and first control lines 121b, which do not overlap the semiconductor members 151a-152b.

The second group of gate members 122a and 122b includes second control electrodes 122a overlapping the third and the fourth semiconductor members 152a and 152b, and second control lines 121b, which do not overlap the semiconductor members 151a-152b.

The third group of gate members 123a, 123b and 123f includes third control electrodes 123a intersecting the first and the third semiconductor members 151a and 152a, fourth control electrodes 123f overlapping the second and the fourth semiconductor members 151b and 152b, and a third gate line 123b, which does not overlap the semiconductor members 151a-152b.

The first and the third control electrodes 121a and 123a partition each of the first and the second semiconductor members 151a and 151b into three portions, i.e., upper, middle and lower portions, which are doped with N type impurity. Like wise, the third and the second control electrodes 123a and 122a partition the third semiconductor member 152a into upper, middle and lower portions, which are doped with N type impurity, and the fourth and the second control electrodes 123f and 122a partition the fourth semiconductor member 152b into upper, middle and lower portions. However, portions of the semiconductor members 151a-152b under the control electrodes 121a, 122a, 123a and 123f are not doped.

An interlayer insulating layer 160 is formed on the gate members 121a-123f. The interlayer insulating layer 160 has a plurality of contact holes 161a-161d exposing the gate members 121a-123f, and the gate insulating layer 140 and the interlayer insulating layer 160 have a plurality of contact holes 162a-162h exposing the semiconductor members 151a-152b. In detail, the contact holes 161a, 161c and 161d expose the control electrodes 121a, 122a, 123a and 123f, while the contact holes 161b expose the control lines 121b, 122b and 123b. The contact holes 162a and 162b expose the upper portions of the first and the second semiconductor members 151a and 151b, respectively, and the contact holes 162c and 162d expose the lower portions of the first and the second semiconductor members 151a and 151b, respectively. The contact holes 162e and 162f expose the upper portions of the third and the fourth semiconductor members 152a and 152b, respectively, and the contact holes 162g and 162h expose the lower portions of the third and the fourth semiconductor members 152a and 152b, respectively.

A plurality of data members 121c, 122c, 123c-123e and 170a-170d (abbreviated to 121c-170d) are formed on the interlayer insulating layer 160.

The data members 121c-170d include first gate connections 121c, 122c and 123c connected to the respective control electrodes 121a, 122a and 123a through the contact holes 161a and connected to the respective control lines 121b, 122b and 123b through the contact holes 161b, and it also includes second gate connections 123d and 123e connected to the third control electrodes 123a through the contact holes 161c and 161d, respectively, and connected to the fourth control electrodes 123f through the contact holes 161a.

The data members 121c-170d further includes a first voltage line 170a transmitting a gate-off voltage (or Vss voltage) for turning off the TFTs on the display area A and connected to the upper portions of the first and the second semiconductor members 151a and 151b through the respective contact holes 162a and 162b, and a second voltage line 170d transmitting a gate-on voltage (or Vdd voltage) for turning on the TFTs on the display area A and connected to the lower portions of the third and the fourth semiconductor members 152a and 152b through the respective contact holes 162g and 162h.

In addition, the data members 121c-170d include first and second output electrodes 170b and 170c connected to the lower portions of the first and the second semiconductor members 151a and 151b through the respective contact holes 162c and 162d and connected to the upper portions of the third and the fourth semiconductor members 152a and 152b through the respective contact holes 162e and 162f.

Each of the first semiconductor members 151a-152b and the control electrodes 121a and 123a or 122a and 123a form double TFTs connected in parallel. The TFTs including the first and the second semiconductor members 151a and 151b are N type transistors, while the TFTs including the third and the fourth semiconductor members 152a and 152b are P type transistors. Therefore, the output electrodes 170b and 170c alternatively outputs the gate-off voltage (or Vss voltage) and the gate-on voltage (or Vdd voltage) in response to the operations of the TFTs.

As described above, the control electrodes 121a, 122a, 123a and 123f and the control lines 121b, 122b and 123b are connected via the several connections 121c, 122c and 123c-123e. Accordingly, the damages on the semiconductor members due to electrostatic charges introduced through the control lines 121b, 122b and 123b can be reduced.

Although it is not shown in the figures, the gate lines and the data lines on the display area A are preferably made of the same layers of the gate members 121a-123f, the data members 121c-170d. Furthermore, the TFTs on the display area A preferably have the same layered structure as the TFTs on the driving circuit areas B.

An additional insulating layer may be formed on the data members 121c-123f if it is required particularly in the display area A.

A method of manufacturing a TFT array panel including the circuit area shown in FIGS. 2A and 2B according to an embodiment of the present invention is described in detail with reference to FIGS. 3A-5B as well as FIGS. 2A and 2B.

Figure 4A:
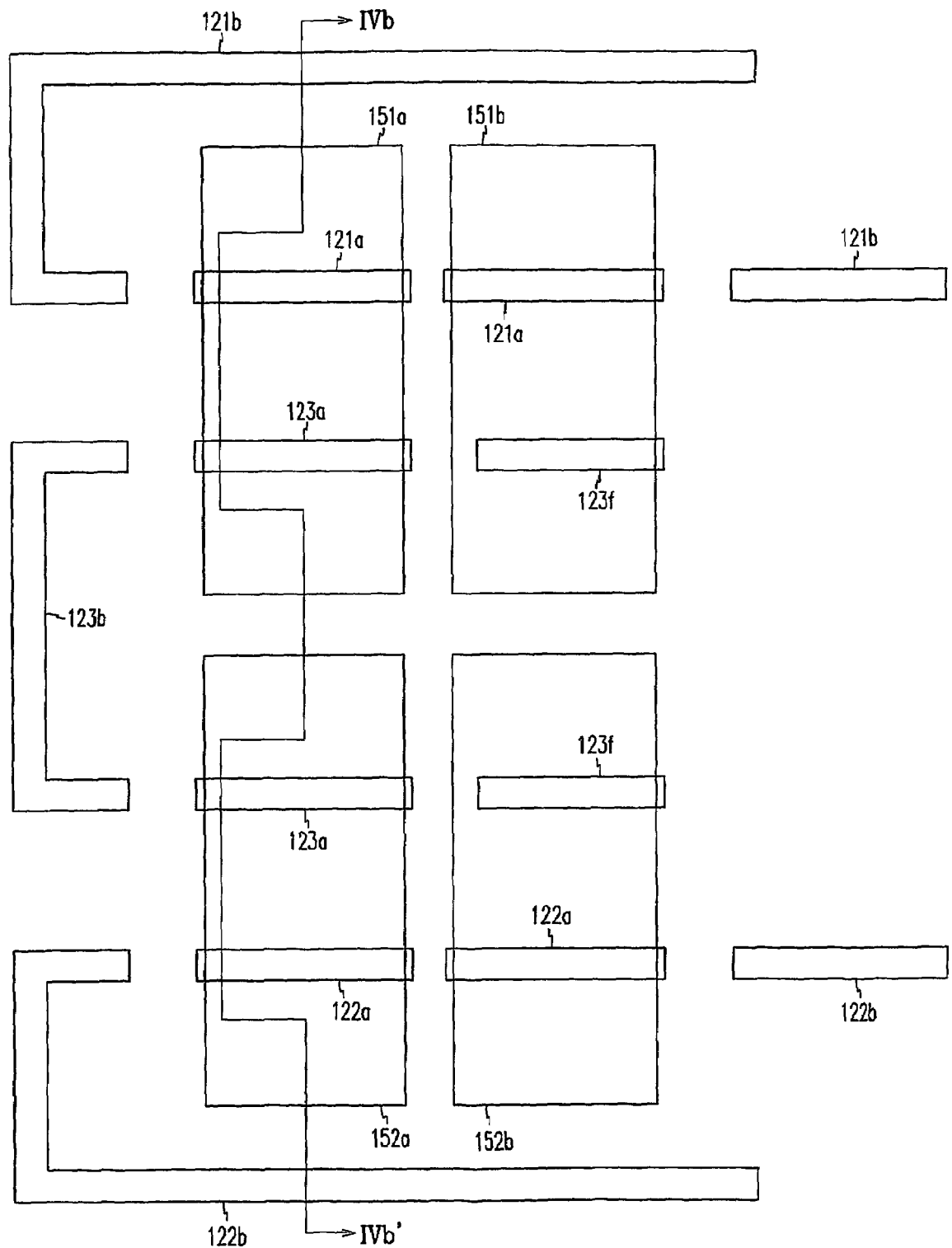
Figure 4B:
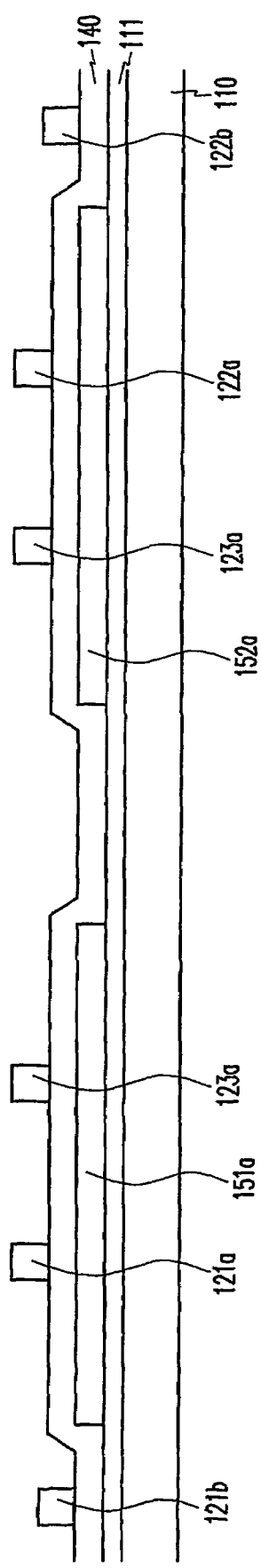
Figure 5A:
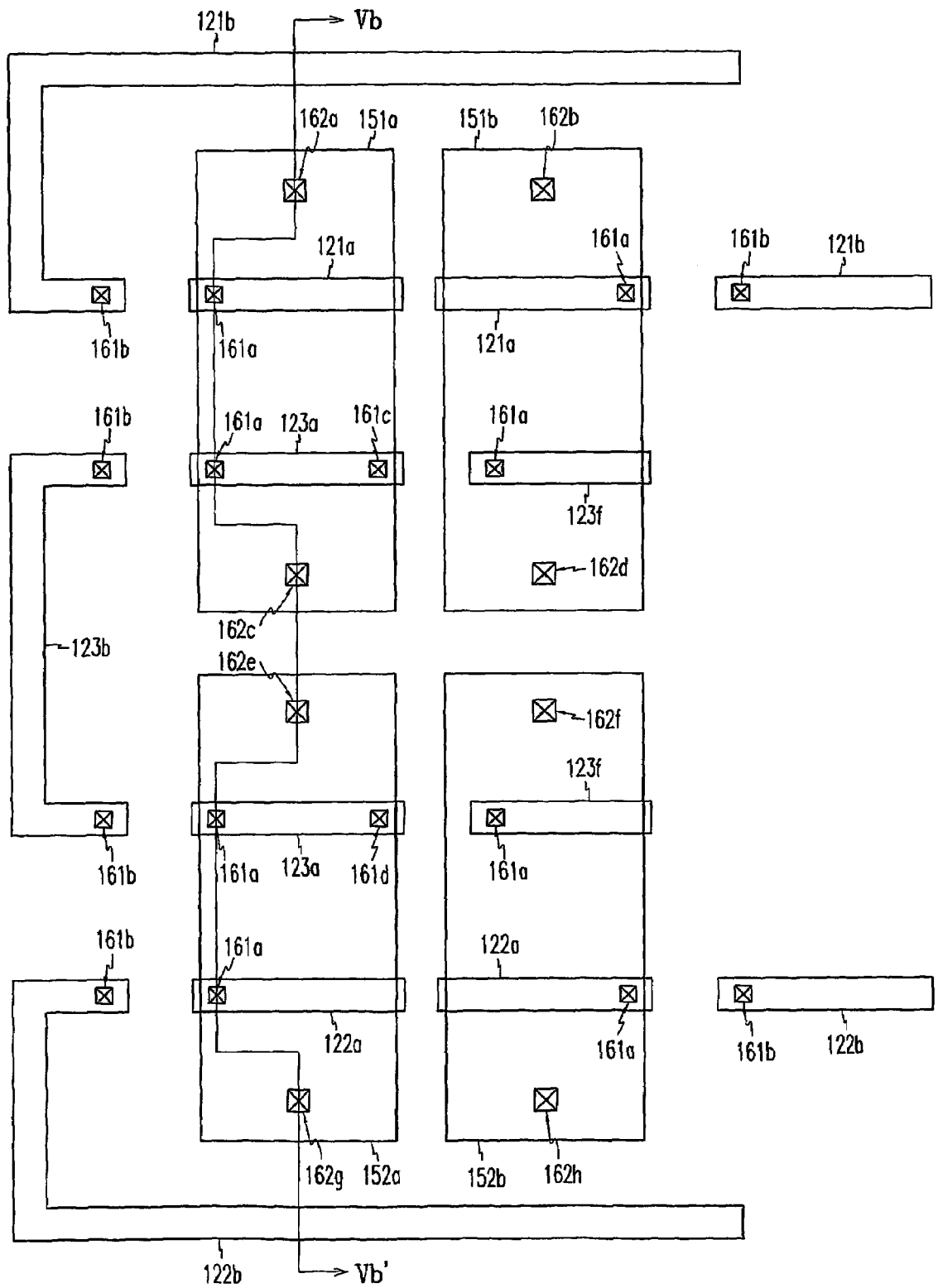
Figure 5B:
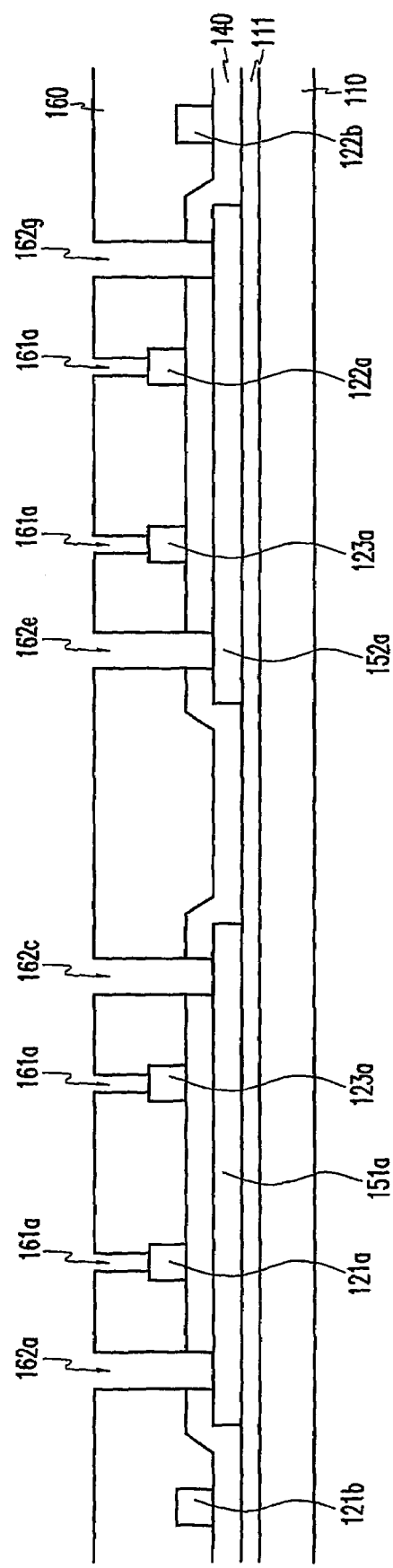

FIGS. 3A, 4A and 5A are layout views of a TFT array panel in intermediate steps of a manufacturing method thereof, and FIGS. 3B, 4B and 5B are sectional views of the TFT array panel shown in FIGS. 3A, 4A and 5A taken along the lines IIIB-IIIB', IVB-IVB' and VB-VB', respectively.

Referring to FIGS. 3A and 3B, a blocking layer 111 and an amorphous silicon film is deposited on a transparent insulating substrate 110. The amorphous silicon film is crystallized into a polysilicon film by heat treatment using laser annealing or furnace. The polysilicon film is patterned to form first and second polysilicon members 150a and 150b. A plurality of polysilicon members (not shown) for TFTs on a display area A are also formed in this step.

Referring to FIGS. 4A and 4B, a gate insulating layer 140 preferably made of $SiO_2$ or $SiN_x$ is formed on the polysilicon members 150a and 150b. A metal layer is deposited on the gate insulating layer 140 and patterned to form a plurality of gate members 121a-123f including a plurality of control electrodes 121a, 122a, 123a and 123f and a plurality of control lines 121b, 122b and 123b.

Next, N type impurity implantation is performed using the gate members 121a-123f as an implantation mask to form first and second semiconductor members 151a and 151b from the polysilicon member 150a. At this time, the polysilicon members 150b may be blocked by a photoresist pattern. Thereafter, a photoresist pattern (not shown) is formed on the first and the second semiconductor members 151a and 151b and P type impurity implantation is performed to third and fourth semiconductor members 152a and 152b. The sequence of N type impurity implantation and P type impurity implantation may be changed.

At this time, since the gate members 121a-123f are divided into several pieces, electrostatic charges are not transferred to the semiconductor members 151a-152b. In particular, the electrostatic charges introduced in the control lines 121b, 122b and 123b, which are relatively long and large, are hardly transferred to the control electrodes 121a, 122a, 123a and 123f since they are separated from the control lines 121b, 122b and 123b. Although the charges are transferred to the control electrodes 121a, 122a, 123a and 123f, the semiconductor members 151a-152b may not be damaged since the control electrodes 121a, 122a, 123a and 123f are too small and short and the difference in the area between the control electrodes 121a, 122a, 123a and 123f is too small to generate voltage difference sufficient for damaging the semiconductor members 151a-152b.

Referring to FIGS. 5A and 5B, an interlayer insulating film 160 is formed on the semiconductor members 151a, 151b, 152a and 152b and photo-etched along with the gate insulating layer 140 to form a plurality of contact holes 161a-161d and 162a-162h exposing the gate members 121a-123f and the semiconductor members 151a, 151b, 152a and 152b.

Finally, a metal layer is formed on the interlayer insulating layer 160 and patterned to form a plurality of data members 121c-170d as shown in FIGS. 2A and 2B.

As described above, since the gate members are divided into several pieces, electrostatic charges are not transferred to the semiconductor members. In addition, although the charges are transferred to the control electrodes, the semiconductor members may not be damaged since the control electrodes are too small and short to generate voltage difference sufficient for damaging the semiconductor members.

While the present invention has been described in detail with reference to the embodiments, those skilled in the art will appreciate that various modifications and substitutions can be made thereto without departing from the spirit and scope of the present invention as set forth in the appended claims.

What is claimed is:

1. A thin film transistor (TFT) array panel, comprising:
   an insulating substrate;
   first and second semiconductor members formed on the substrate and having opposite conductivity;
   a first gate member formed on a first layer, insulated from the first and the second semiconductor members and overlapping one of the first and the second semiconductor members;
   a second gate member formed on the first layer, separated from the first gate member, and insulated from the first and the second semiconductor members, the second gate member not overlapping the first and the second semiconductor members;
   a first data member formed on a second layer, connected to one of the first and the second semiconductor members and insulated from the first and the second gate members; and
   a first connection formed on the second layer and connecting the first gate member and the second gate member.

2. The TFT array panel of claim 1, wherein the first and the second semiconductor members comprise polysilicon.

3. The TFT array panel of claim 2, wherein the first gate member overlaps the first semiconductor member.

4. The TFT array panel of claim 3, further comprising a third gate member formed on the first layer, separated from the first and the second gate members, insulated from the first and the second semiconductor members, and overlapping the second semiconductor member.

5. The TFT array panel of claim 4, further comprising a second connection formed on the second layer and connecting the second gate member and the third gate member.

6. The TFT array panel of claim 4, further comprising:
   a fourth gate member formed on the first layer, separated from the first, the second, and the third gate members and insulated from the first and the second semiconductor members, the fourth gate member not overlapping the first and the second semiconductor members; and
   a second connection formed on the second layer and connecting the third gate member and the fourth gate member.

7. The TFT array panel of claim 6, further comprising:
   fifth and sixth gate members formed on the first layer, separated from the first to the fourth gate members, insulated from the first and the second semiconductor members, and overlapping the first and the second semiconductor members, respectively;
   a seventh gate member formed on the first layer, separated from the first to the sixth gate members and insulated from the first and the second semiconductor members, the seventh gate member not overlapping the first and the second semiconductor members; and
   third and fourth connections formed on the second layer and connecting the fifth and the sixth gate members to the seventh gate member.

8. The TFT array panel of claim 7, further comprising a fifth connection formed on the second layer and connecting the first semiconductor member and the second semiconductor member.

9. The TFT array panel of claim 8, further comprising:
   third and fourth semiconductor members formed on the substrate and having opposite conductivity;
   eighth and ninth gate members formed on the first layer, separated from the first to the seventh gate members, insulated from the first to the fourth semiconductor members, overlapping the third and the fourth semiconductor members, respectively; and
   sixth and seventh connections formed on the second layer and connecting the fifth and the sixth gate members to the eighth and the ninth gate members, respectively.

10. The TFT array panel of claim 9, further comprising;
    tenth and eleventh gate members formed on the first layer, insulated from the first to the fourth semiconductor members and overlapping the third and the fourth semiconductor members, respectively; twelfth and thirteenth gate members formed on the first layer, separated from the first to the eleventh gate members, and insulated from the third and the fourth semiconductor members, the twelfth and the thirteenth gate members not overlapping the first to the fourth semiconductor members; and eighth and ninth connections formed on the second layer and connecting the tenth and the eleventh gate members to the twelfth and the thirteenth gate members, respectively.

11. The TFT array panel of claim 10, further comprising a tenth connection formed on the second layer and connecting the third semiconductor member and the fourth semiconductor member.

12. The TFT array panel of claim 11, wherein the first data member is connected to the first and the third semiconductor members.

13. The TFT array panel of claim 12, further comprising a second data member connected to the second and the fourth semiconductor members and insulated from the first to the thirteenth gate members.

14. The TFT array panel of claim 13, wherein the first data member transmits a gate-off voltage for turning off a thin film transistor and the second data member transmits a gate-on voltage for turning on the thin film transistor.

15. The TFT array panel of claim 1, further comprising:
a first insulating layer interposed between the first and the second semiconductor members and the first and the second gate members; and
a second insulating layer interposed between the first and the second gate members and the first data member,
wherein the second insulating layer has a first contact hole for connecting the first gate member and the second gate member, and the first and the second insulating layer has a second contact hole for connecting the first data member and the one of the first and the second semiconductor members.

* * * * *